(12) United States Patent
Tsironis

(10) Patent No.: US 12,347,916 B1
(45) Date of Patent: Jul. 1, 2025

(54) WAVEGUIDE SLIDE SCREW TUNER AND METHOD

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 340 days.

(21) Appl. No.: 17/965,900

(22) Filed: Oct. 14, 2022

(51) Int. Cl.
    *H03H 7/40* (2006.01)
    *G01R 31/28* (2006.01)
    *H01P 1/22* (2006.01)
    *H01P 5/04* (2006.01)

(52) U.S. Cl.
    CPC ............ *H01P 5/04* (2013.01); *G01R 31/2822* (2013.01); *H01P 1/222* (2013.01); *H03H 7/40* (2013.01)

(58) Field of Classification Search
    CPC ....... H01P 5/04; H01P 1/222; G01R 31/2822; H03H 7/38; H03H 7/40
    See application file for complete search history.

(56) References Cited

U.S. PATENT DOCUMENTS

| | | | |
|---|---|---|---|
| 5,910,754 A | 6/1999 | Simpson et al. | |
| 6,674,293 B1 | 1/2004 | Tsironis | |
| 6,992,538 B1* | 1/2006 | Boulerne | G01R 31/2822 333/263 |
| 7,595,709 B1* | 9/2009 | Boulerne | G01R 31/2601 333/263 |
| 8,841,921 B1* | 9/2014 | Tsironis | G01R 27/28 324/637 |
| 8,896,401 B1* | 11/2014 | Tsironis | H01P 5/04 333/263 |
| 9,148,127 B1* | 9/2015 | Lee | G01R 1/06705 |
| 9,625,556 B1* | 4/2017 | Tsironis | G01R 27/32 |
| 9,709,654 B2* | 7/2017 | Simpson | G01R 31/2822 |
| 10,177,428 B1* | 1/2019 | Tsironis | H01P 1/222 |
| 10,276,910 B1* | 4/2019 | Tsironis | H01P 5/183 |
| 11,095,013 B1* | 8/2021 | Tsironis | H02N 2/026 |
| 11,867,736 B1* | 1/2024 | Tsironis | G01R 31/2822 |

OTHER PUBLICATIONS

"Load Pull Measurements" [online] Wikipedia, [Retrieved on Nov. 18, 2016]. Retrieved from Internet <URL: https://en.wikipedia.org/wiki/Load_pull>.
"W Band Programmable Tuner Model 11075", Product Note PN-43, Focus Microwaves, Aug. 1997.
"Signal-flow graph" [online], Wikipedia [Retrieved on Aug. 31, 2021 from Internet] <URL: https://en.wikipedia.org/wiki/Signal-flow_graph>.
"Linear Actuator" [online], Wikipedia [Retrieved on Apr. 25, 2020 from Internet] <URL: https://en.wikipedia.org/wiki/Linear_actuator>.

* cited by examiner

*Primary Examiner* — Stephen E. Jones

(57) ABSTRACT

A new two-probe waveguide slide screw load-pull tuner of which the probes share the same waveguide section; they are inserted diametrically at fixed depth into slots facing each other on opposite broad walls of the waveguide. The tuner does not have cumbersome adjustable vertical axes controlling the penetration of the probes and its low profile is optimized for on-wafer operations. The carriages holding the probes are moved along the waveguide using electric stepper motors or linear actuators. The calibration uses mutual de-embedding of initialized probes and is 20 or more times faster than the full probe permutations calibration.

8 Claims, 10 Drawing Sheets

WAVEGUIDE SLIDE SCREW TUNER AND METHOD

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. W Band Programmable Tuner Model 11075, Product Note PN-43, Focus Microwaves, August 1997.
3. Tsironis C., U.S. Pat. No. 6,674,293, "Adaptable Pre-Matched Tuner System and Method".
4. Simpson G., et al., U.S. Pat. No. 5,910,754, "Reduced height waveguide tuner for impedance matching", FIG. 8.
5. "Signal-flow graph" [online], Wikipedia [Retrieved on Aug. 31, 2021 from Internet]<URL: https://en.wikipedia.org/wiki/Signal-flow_graph>.
6. "Linear Actuator" [online], Wikipedia [Retrieved on Apr. 25, 2020 from Internet]<URL: https://en.wikipedia.org/wiki/Linear_actuator>.

BACKGROUND OF THE INVENTION

This invention relates to load and source pull testing of millimeter-wave transistors and amplifiers using remotely controlled electro-mechanical waveguide impedance tuners.

A popular method for testing and characterizing RF and millimeter-wave transistors in their non-linear region of operation is "load pull" (see ref 1). Load pull is a semiconductor device (transistor) characterization technique employing automatic microwave impedance (load-pull) tuners and other microwave test equipment as shown in FIG. 1. The waveguide tuners 2, 4 (see ref 2) are used in order to manipulate the microwave impedance conditions under which the Device Under Test (DUT, or transistor, 3) is tested; the stimulus test signal is provided by a signal source 1 and the out-coming power is measured by a power meter 5; the whole is controlled by a PC controller 6, which includes an electronic digital interface to communicate with the instruments 1, 5 and the tuners 2, 4 using control and communication cables 7, 8 and 9.

DESCRIPTION OF PRIOR ART

Waveguide impedance tuners include, in general, a low-loss waveguide transmission line 26, FIG. 2A, and a conductive tuning element (tuning probe, 20) inserted in a slot 28 machined into the waveguide 23 parallel to its longitudinal axis; the probe 20 is a, at least partly, conductive rod, block, sliver or stub, is attached to a complex, high precision, adjustable vertical axis 22, controlled by a stepper motor 25 and is inserted vertically into the slot 28 and moved along the axis of the waveguide using a gear such as an ACME screw 24; this movement of the tuning probe creates, in a certain frequency range, a controllable variable reactance which allows the synthesis of various impedances (or reflection factors) which are present at the test port 27, covering the quasi totality of the Smith chart (the polar impedance mapping display shown as normalized reflection factor, FIG. 3). The impedance synthesis using the tuning probe 20 follows a path 30, 31 between the matched load at the origin (50Ω) of the Smith chart and an arbitrary reflection factor TARGET-1. Inserting the tuning probe into the slot creates a controlled reflection following path 30 and moving the probe along the slot follows path 31. The relation between reflection factor Γ and impedance Z is given by Γ=(Z−Zo)/(Z+Zo), wherein Z=R+jX and wherein Zo is the characteristic impedance. A typical value used for Zo is 50Ω.

When conductive tuning probes (typically metallic or metalized rods) 20, FIG. 2, penetrate into the waveguide 26, they capture and deform the electric field, which is then concentrated in the area 29 between the bottom tip of the probe 20 and the ground plane 23 of the waveguide. This field deformation creates a capacitive effect, sends injected signal power back and allows generating high and controllable reflection factors. The main disadvantage of this embodiment is the requirement for high precision and resolution and, by consequence, tall and cumbersome vertical probe movement mechanisms 22, see ref 4, which must be very precise, especially when the probe is at maximum depth, very close to the bottom of the waveguide but also over the entire travel range, because of a hyperbolic behavior of the capacitance created, since the significant portion of reflection occurs when the probe tip is very close to the bottom inner wall of the waveguide (ground plane). This movement process slows down the tuning procedure for two reasons: (a) when the probe is withdrawn, the vertical movement is lengthy and much less effective in terms of generating useful reflection factor increments, and (b), since the vertical moving resolution must be constant, enhanced positioning accuracy and resolution are required all the way due to high tuning sensitivity in the high reflection area, when the probe is deeply inserted and close to the ground plane.

Related prior art (see ref. 4) does not teach impedance tuners with two fixed penetration (or vertical position) tuning probes; prior art tuners require at least one high precision complex vertical axis to be able to tune along path 30-31 in FIG. 3. Neither relevant prior art (see ref. 3 or 4) teach a short tuner using tuning probes sharing the same section of waveguide transmission line and alternatively crossing over. This overlapping structure, though, is essential and compatible with the proposed low profile, compact size tuner and also attractive, because of the high-speed adaptive tuner calibration and operation, which is similar to the basic calibration concept of ref. 3, but which is not identical to it.

BRIEF SUMMARY OF THE INVENTION

The invention discloses a new type waveguide load pull slide screw tuner and calibration and tuning procedures. The tuner uses, other than the totality of the prior art, horizontal-only high-speed movement mechanism of the tuning probes.

The impedance tuner itself, of which a conceptual cross section is shown in FIG. 4, uses a low loss waveguide transmission line 40 and two diametrical tuning probes 42 and 42A. The tuning probes 42, 42A are, typically, at least partially conductive rods and are mounted on mobile carriages 45, 45A sliding along the waveguide transmission line. The carriages are placed facing each-other across the waveguide and slide 43, 43A seamlessly and precisely along the waveguide top and bottom walls guided by high precision sliders. They hold the tuning probes (conductive rods) 42, 42A and keep them inserted into the waveguide cavity at a fixed depth through vertical slots 46, 46A in a non-contacting relationship with the slot walls 21. The slots run parallel to the axis of the waveguide. This tuning mechanism does not require any vertical probe control. In order to allow the tuning probes to cross over without mechanical conflict, the slots are slightly offset of the center line of the waveguide, by at least one diameter (thickness) of a tuning probe. A medium size reflection (S11≈0.5-0.7) is created by either tuning probe leading to the different tuning mechanism as shown in FIG. 3 (traces 32, 33). Both tuning mechanisms shown in FIG. 3 yield the same tuning objective: starting from the matched load (50Ω) they allow tuning to TARGETS-1 or -2. The result is the same, only the control mechanisms differ.

The carriages 45, 45A, 53, 53A are controlled using high-speed electric stepper motors 54, 54A and ACME rods 51, 51A or linear actuators (see ref. 6) thus eliminating this way additional control gear. Last, not least, the tuning mechanism, liberated from cumbersome and expensive high resolution vertical probe control and movement delays, benefits also from inherent lower tuning error sensitivity to mechanical probe positioning tolerances close to |Γ|≈1.

BRIEF DESCRIPTION OF THE SEVERAL VIEWS OF THE DRAWINGS

The invention and its mode of operation will be better understood from the following detailed description when read with the appended drawings, in which:

FIG. 2A depicts a front view of the entire tuner; FIG. 2B depicts a cross section of the tuning probe (typically a conductive rod) entering the waveguide slot.

FIG. 7A depicts the probes far from each-other; FIG. 7B depicts the probes close to each-other entering mutual electromagnetic fields; FIG. 7C depicts the two probes partially or fully overlapping.

DETAILED DESCRIPTION OF THE INVENTION

Figure 1:
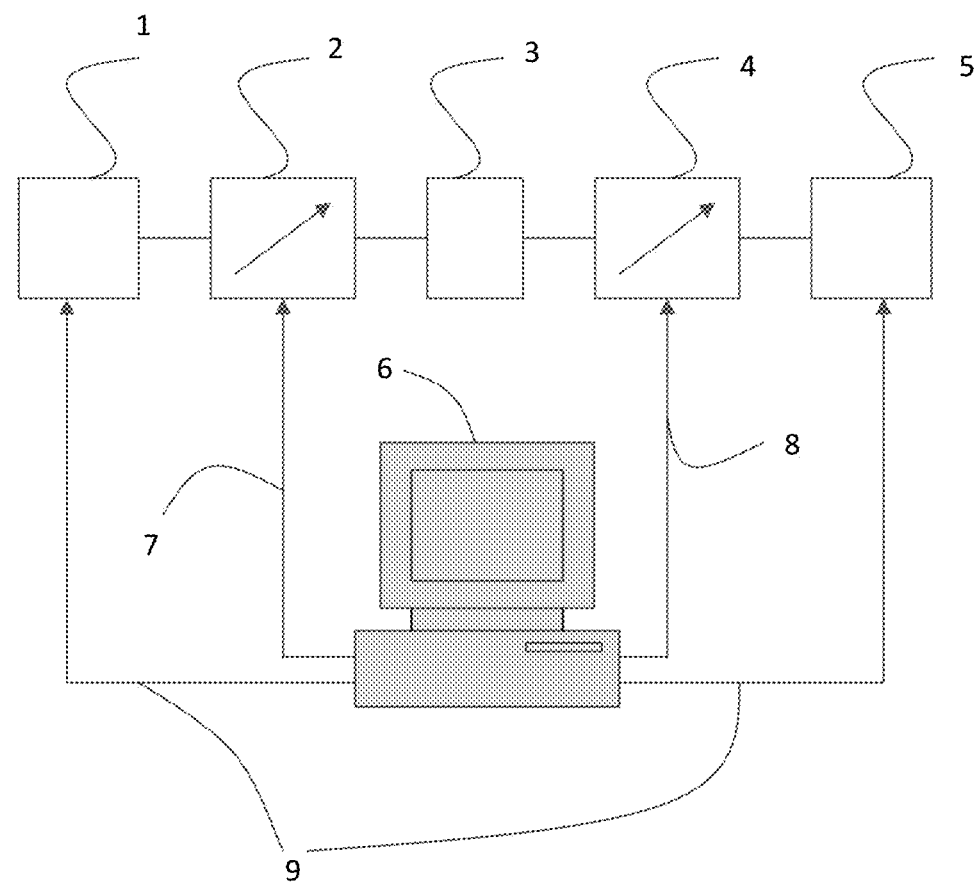
FIG. 1 depicts prior art: a typical generic automated load pull test system.
Figure 2:
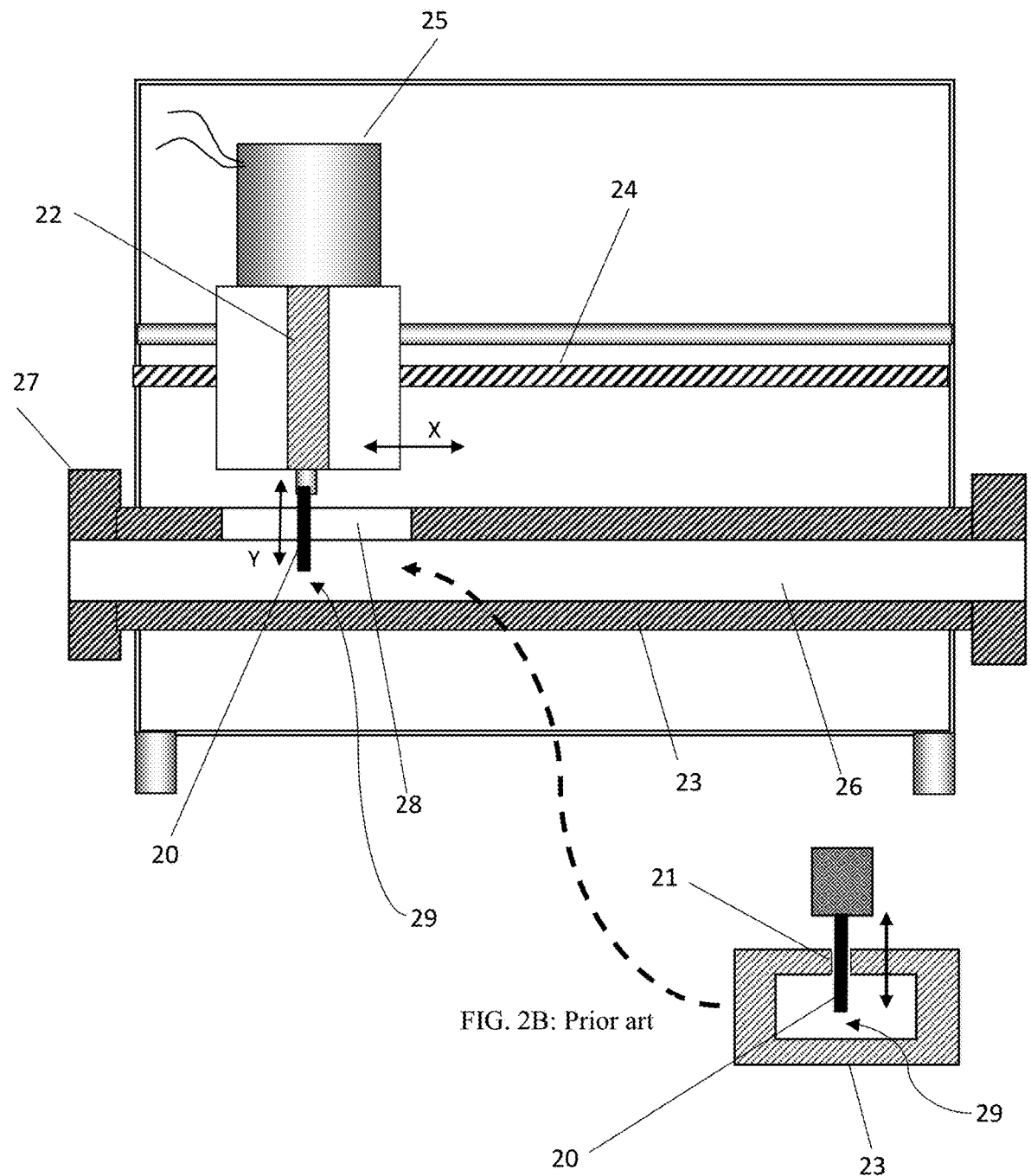
FIGS. 2A through 2B depict prior art: a single probe waveguide impedance tuner.
Figure 3:
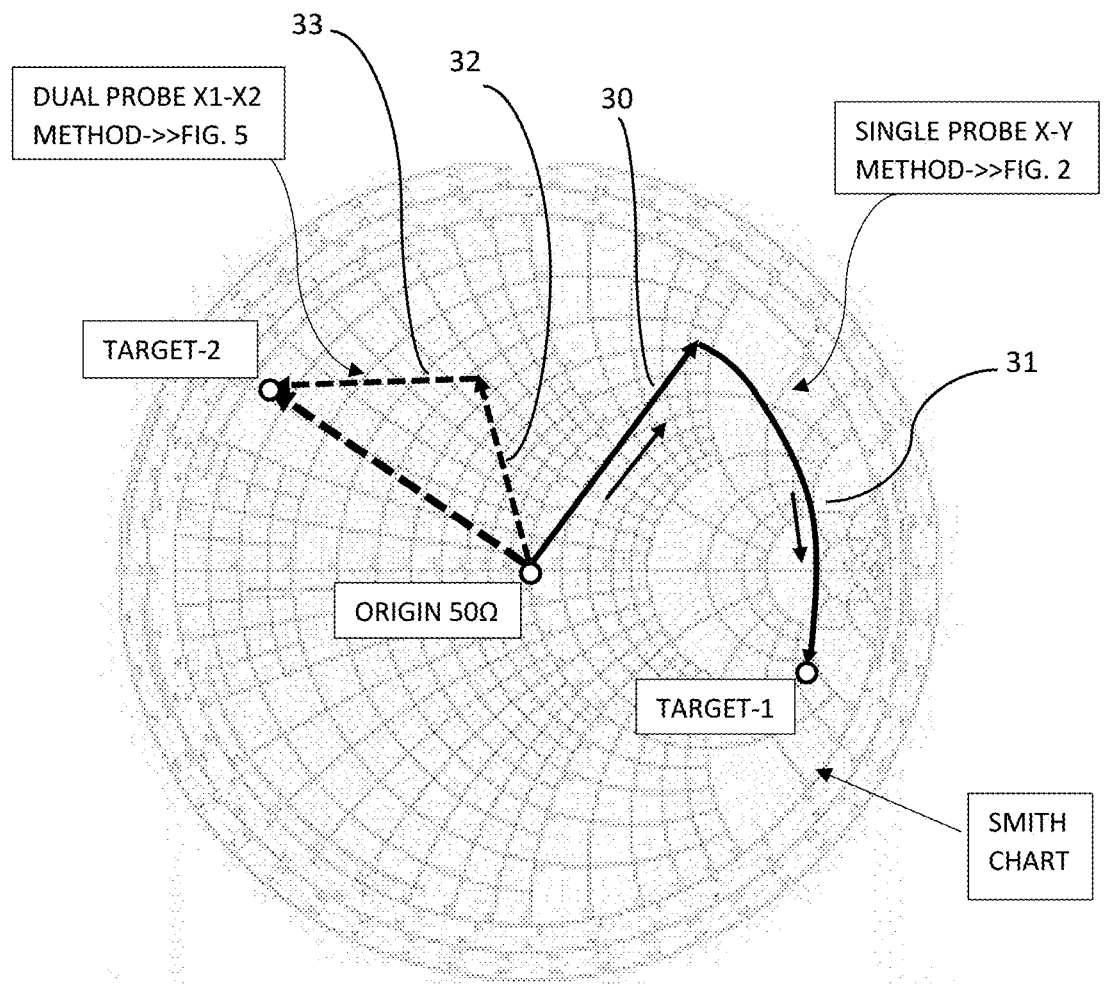
FIG. 3 depicts partly prior art: a Smith chart and two possible trajectories of impedance synthesis (tuning) to reach a target impedance starting from the origin of 501. Reaching TARGET-1 uses the prior art single-probe technique with horizontal and vertical control; reaching TARGET-2 uses the new two-probe method with horizontal-only and without vertical control.
Figure 4:
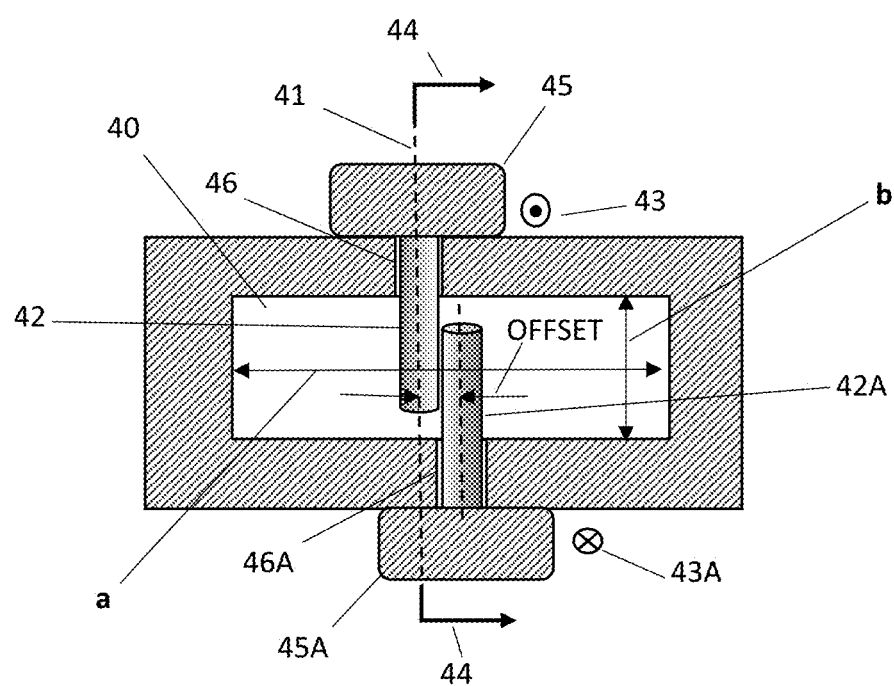
FIG. 4 depicts a cross-section through a waveguide with two conductive tuning rods (probes) entering from opposite sides into slightly offset slots.
Figure 5:
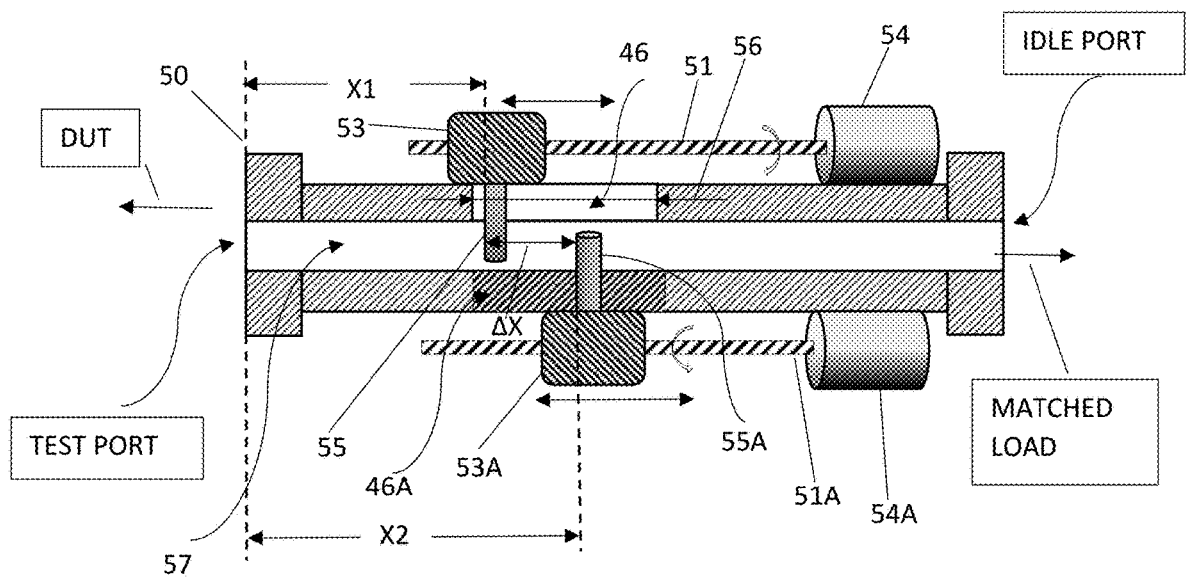
FIG. 5 depicts a front view of the waveguide tuner with two crossing over tuning probes.

This invention discloses a high frequency (RF, microwave, millimeter wave), computer-controlled impedance tuner, suitable for load pull measurements. The tuner (FIG. 5) uses a low loss waveguide transmission airline 57, which includes two broad top walls, two narrow sidewalls and two slots 46, 46A as shown in FIGS. 4 and 5, cut into the broad walls, one on the top and one on the bottom. The slots run parallel to the waveguide longitudinal axis and are positioned opposite to each other and slightly offset from the symmetry center line of the waveguide. The offset eccentricity is selected to allow the two tuning probes (typically metallic or metallized rods 42, 42A) to cross over (pass next to each other) without touching. This structure is chosen for economy of space because it uses slots of a total length 56 of one half of a wavelength plus the thickness of one tuning probe. An alternative configuration, where the tuning rods would not cross over, would, in principle, also work, but the slot (and the tuner) would have to be twice as long. The horizontal control of the carriages 53 and 53A can be made using stepper motors 54 and ACME screws 51 but can also be accomplished using linear electric actuators (see ref. 6), instead of motors 54 and ACME screws. The actuators have a motorized body, and their rotor axis is the extended horizontal ACME screw 51.

FIG. 5 shows a front view of the waveguide tuner created by the cross section 41, 44 of FIG. 4: the slots 46, 46A can be seen as well as their effective length 56; the mobile carriages 53 and 53A are controlled by the ACME screws 51 and 51A along the waveguide 57, via the stepper motors 54, 54A; the coordinate of carriage 53 is X1 and of carriage 53A is X2 relative to a common arbitrary zero position that can be the test port 50. The distance of the first tuning probe 55 from the test port 50 is X1 and the electric distance between the two tuning probes is ΔX=|X1−X2|; the lower slot 46A is hidden in FIG. 5 as it is evident from the cross section 44 in FIG. 4.

The total reflection factor 105 (FIG. 6) is the sum of all internal reflections in the waveguide and a function of the positions X1 and X2 of the two probes: S11(X1,X2) and is the vector-sum of the reflection factors 103 and 104 of both probes S11(X1) and S11(X2): S11(X1,X2)=S11(X1)+S11(X2), all referenced at the test port 50. The tuning probe 55 closest to the test port generates the primary reflection 100 i.e., S11(X1), 103. Since the reflection of the first probe 55 is selected not to be maximum (i.e. >0.9), but is, instead, selected to have medium value |S11(X1)|≈0.5-0.7, there is a signal portion traversing probe 55 towards the secondary probe 55A; this signal portion is then reflected back towards the primary probe 55; again, a portion of this reflected back signal traverses the primary probe towards the test port and adds to the total reflection. The signal reflected at the secondary probe 55A is also reflected back at the primary probe 55, and so on . . . creating the phenomenon of a multiple reflection. In mechanical terms this appears like a turbulence. This back and forth bouncing of signal is well described using signal flow graphs (see ref. 5). Instead, since the tuner is terminated with a matched load any escaping signal is not reflected back and therefore ignored.

Figure 6:
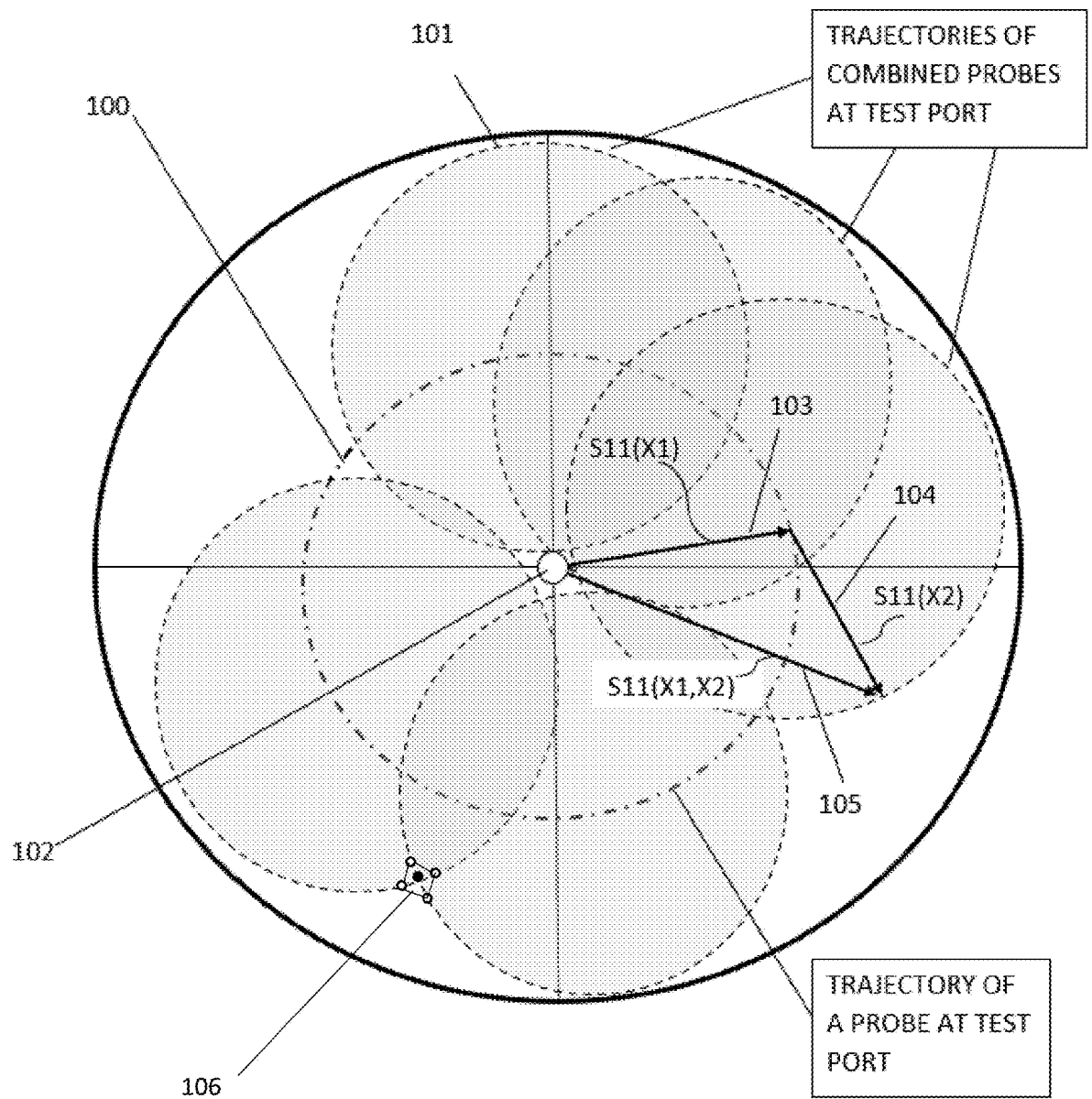
FIG. 6 depicts the impedance synthesis on the Smith chart using the two-probe impedance tuner with fixed probe insertion depth.

FIG. 6 depicts schematically the overall reflection factor synthesis mechanism: each probe creates at its own reference plane reflections $\Gamma_1$ or $\beta_2$, which are concentric reflection factor circles represented at test port reference plane as trace 100 on the Smith chart (FIG. 6). The total reflection factor trace 101 is created by a planetary epicycloid superposition of the two reflection factor vectors around the center 102 (one circle rotates around a point on the periphery of the other). When the probes cross-over the circles swap. The total reflection factor vector 105 is created by the vector sum of vector 103 (from the first probe) and the vector 104 (from the second vector) as described above.

To be used in impedance synthesis the tuner must be calibrated and the calibration data must be used to generate the proper probe positions to reach a TARGET impedance. To create a reasonable accuracy each probe of the tuner must be characterized at least at 100 positions between X=0 and X=XMAX=λ/2; in terms of a typical circular trajectory 100 (FIG. 6) this corresponds to steps of 3.6°. At 50 GHz using a waveguide class WR19 with internal dimensions of the cavity of a=4.8 mm, b=2.4 mm (FIG. 4) this corresponds to %=8 mm and mechanical steps of 0.04 mm. To calibrate all 100×100=10,000 tuner states (calibration points) one would need at least 10,000 seconds or 2.8 hours, at 1 second per point. The new method disclosed here allows reducing this time to approximately 8.4 minutes.

Figure 7A:
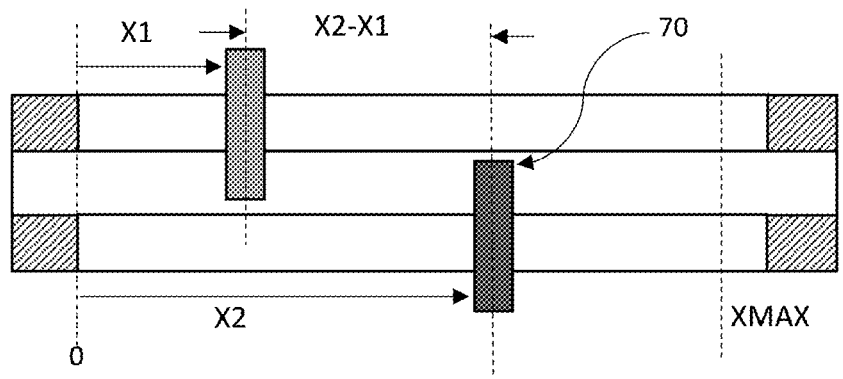
FIGS. 7A through 7C depict possible relative positions of the two tuning probes.
Figure 7B:
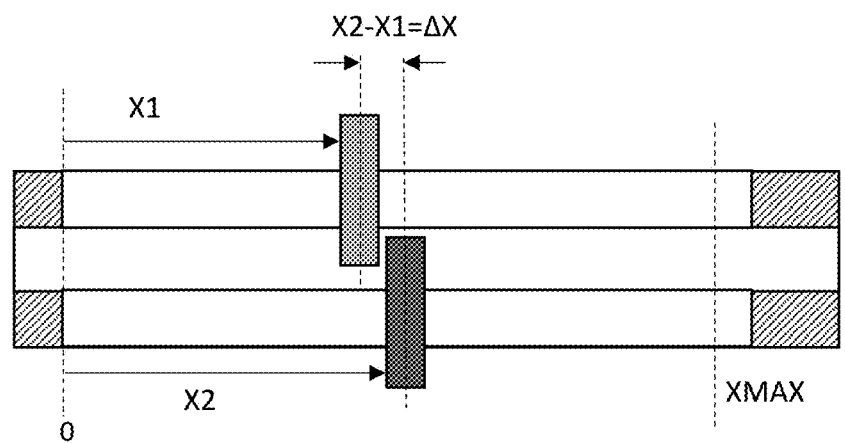
Figure 7C:
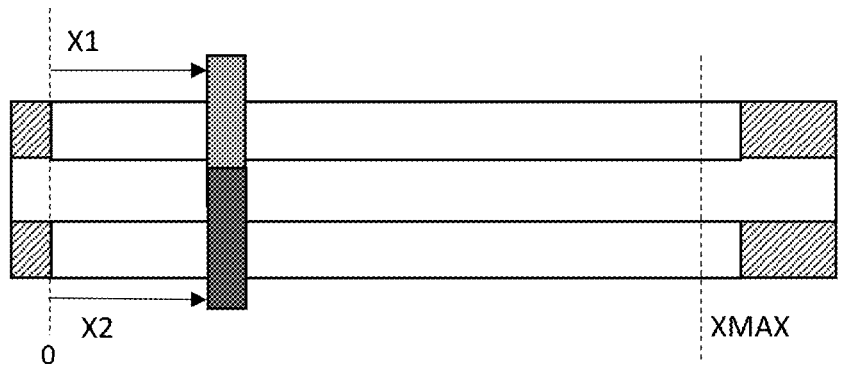
Figure 8:
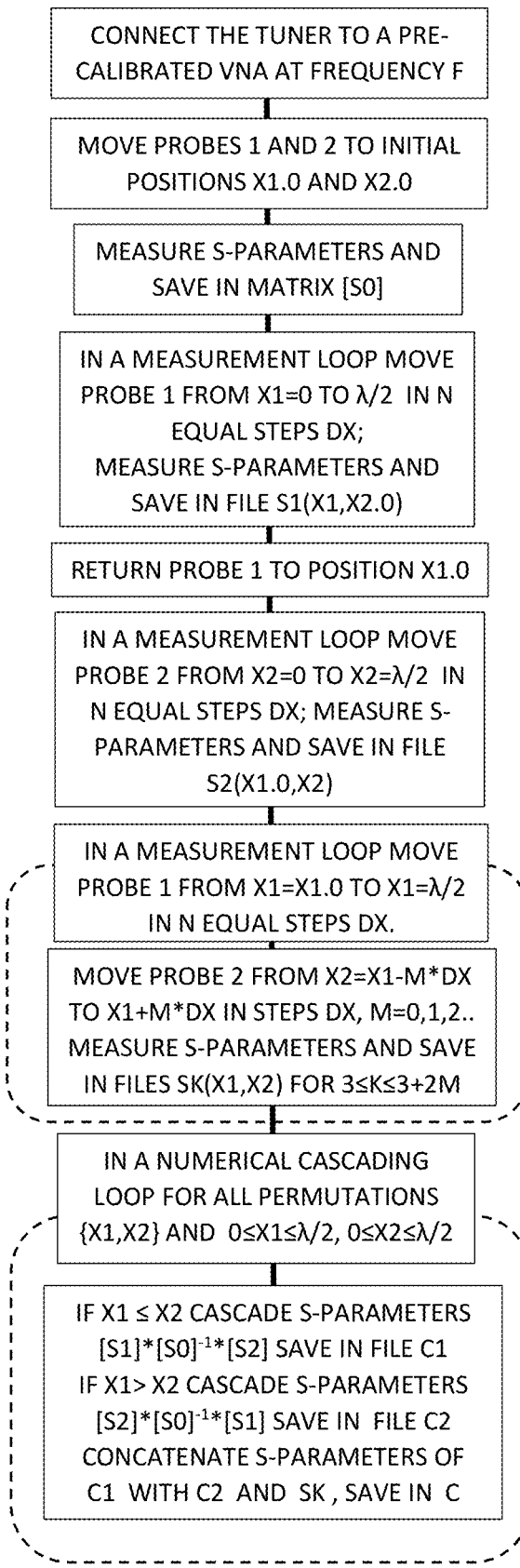
FIG. 8 depicts the tuner calibration flow-chart.

The calibration procedure executes as follows (FIG. 8): The tuner is connected to a pre-calibrated vector network analyzer (VNA); then the two probes are placed to initial positions, for instance probe 1 at X1=X1.0=0 and probe 2 at X2=X2.0=XMAX=λ/2; then scattering (s-) parameters are measured and saved in a init matrix [S0]; then, in a first measurement loop probe 1 is moved in a number N (typically 100) of steps ΔX from X1=0 to X1=XMAX and s-parameters are measured and saved in a matrix [S1]=[S(X1,X2.0)] containing 4 sets of two-port s-parameters. In a next measurement loop probe 1 is returned to its initial position X1.0 and probe 2 is moved from X2=XMAX to X2=0 and s-parameters are measured and saved in a matrix [S2]=[S(X1.0,X2)]. The total data are saved in data files S1 and S2 comprising N sets of s-parameters each. In real tuning, though, there will be situations where the two probes will be near each-other or even overlap (FIG. 7B-7C). If we define "near" as the positioning of a probe at least one step left and one step right of the other probe, then we have a total of at least three positions where one probe affects the other, so a total of at least 3N positions; a third measurement loop is then, in the simplest scenario, as follows: Probe 1 moves from X1=0 to X1=XMAX in N steps of length ΔX=/(2N); then probe 2 moves to three positions, one ahead, one opposite and one after probe 1: X2=X1−ΔX, X2=X1 and X2=X1+ΔX, and each time we measure s-parameters and save in matrices [S3]=[S(X1,X1−ΔX)], [S4]=[S(X1,X1)] and [S5]=[S(X1,X1+ΔX)]; the totality of these measurements are saved in data files S3 to S5 etc., comprising N sets of s-parameters each. This makes for a total of 2×N+3×N=5×N measurements, instead of $N^2$ measurements, a time reduction of $N^2/(5N)=N/5$; in the case of N=100 the new calibration method is 20 times faster. In the case of N=200 and two adjacent calibration points, allowing to increase the calibration density and cross-over accuracy, the time improvement ratio becomes $N^2/(7N)≈29$.

In a next step the hitherto measured calibration data of the individual probes are used to generate the tuner calibration file as follows: for all X1, X2 permutations, symbolized as {X1,X2}, except for the probe-interacting or -overlapping cases, where X1−ΔX≤X2≤X1+ΔX, cascade the matrices [S1], [S2] and [S0] as follows: if X1≤X2, cascade [S1]*[S0]$^{-1}$*[S2] and save in a first portion of the tuner calibration file C1; if X1>X2, cascade [S2]*[S0]$^{-1}$*[S1] and save in a second portion of the tuner calibration file C2. In a final step, insert the s-parameter data matrices [S3], [S4] and [S5] into, and replace, the concatenated s-parameter data of C1 and C2 to create the overall calibration file C. Or, the s-parameter data in file C include sets of tuner s-parameters between the test port and the idle port for all $N^2$ permutations of X1 and X2 positions every ΔX=λ/(2N) steps including: ($N^2$−3N) cascaded and de-embedded s-parameters of the individual probes and 3N directly measured s-parameter sets of probes overlapping or in proximity. In the case of 5 or more directly measured overlapping and adjacent points this number becomes $N^2$−5N, $N^2$−7N etc. . . . . .

Figure 9:
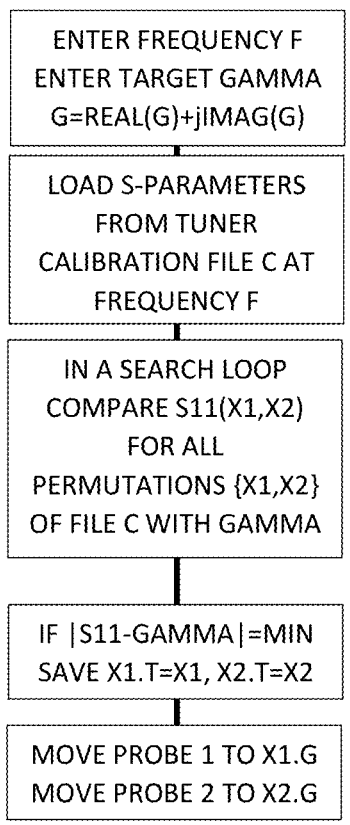
FIG. 9 depicts the impedance synthesis flow-chart.
Figure 10:
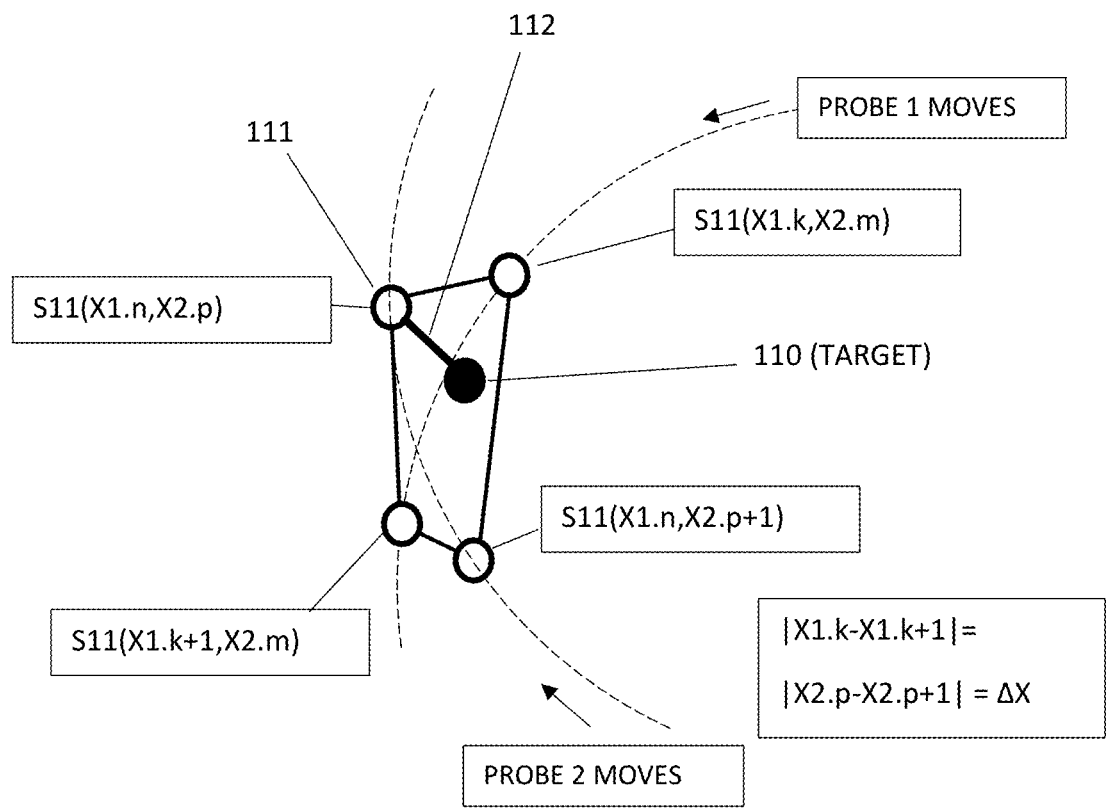
FIG. 10 depicts a TARGET reflection factor inside a calibration "pixel".

Tuning is the procedure of synthesizing a TARGET reflection factor using the calibrated tuner, i.e., determining the best probe positions X1, X2 that create a desired reflection factor 110 (see tuning algorithm in FIG. 9 and interpolation details in FIG. 10). Tuning accuracy is the vector difference 112 between the user-defined target reflection factor 110 and the closest synthesized calibration point 111. Assuming the tuner is calibrated at 100×100=10,000 settings (X1, X2): in a first rough approximation, on the Smith chart with a radius of 1 having a surface of π, the size of each pixel is $π/10^4$ and, in a worst case scenario, as shown in FIG. 6, item 106, if a target is in the center of a contour defined by the surrounding pixel (four calibrated points), the possible error, i.e., the difference of the closest calibrated point from the target is $20 \log(\text{sqrt}(π/2)*10^{-2}))≈−38$ dB; in this case tuning is a simple search through the data points vector S11(X1,X2) of the calibration file C using an error function EF=|TARGET−S11| to minimize. This search could use optimized searching Real(S11) and Imag(S11) separately and should not last more than a few milliseconds. If the accuracy of −38 dB seems too coarse, then the number of calibrated points could be increased to 150 or 200 per axis with, still reasonable, calibration time and reach accuracies of $20 \log(\text{sqrt}(π/2)/3*10^{-2}))≈−41$ dB or $20 \log(\text{sqrt}(π/(2)/4*10^{-2}))≈−44$ dB etc. Even if every doubling of the number of horizontal steps doubles the, already inherently low, calibration time, it increases the accuracy by at least 6 dB.

If the number N of calibration steps per tuning probe increases, in order to enhance the tuning accuracy and, depending on the form of the tuning probes (rods, slivers or else) it is possible that the interaction between probes spreads to more than plus and minus one step beyond overlapping. This is not probable, because the electric field is concentrated at the closest point 70 between the capacitive tuning probe and the opposite inner ground wall, but, depending on the number N and the step size ΔX=λ/(2N) it cannot be excluded. In this case the number of calibration points before and after the probe overlapping should be increased to ±2, or ±3. In this case the calibration time increases as well, but the calibration procedure remains the same, as does the tuning algorithm.

Obvious alternative embodiments of fixed penetration tuning probes, diametrically inserted into and sharing the same slabline of waveguide slide screw impedance tuners and associated calibration and tuning methods shall not impede on the core idea of the present invention.

What is claimed is:

1. A calibration method for a waveguide slide screw tuner having a test port and an idle port, and two tuning probes, a first tuning probe and a second tuning probe, inserted diametrically and laterally offset to each other into slots on opposite broad walls of the waveguide and movable at constant penetration along the waveguide, comprising the following steps:
   a) connect the tuner to a VNA pre-calibrated at a frequency F;
   b) move the tuning probes to initial positions, the first tuning probe to X1.0 and the second tuning probe to X2.0;
   c) measure s-parameters of the tuner and save in an init matrix [S0];
   d) in a first move-measurement loop
      d1) move the first tuning probe from X1=X1.0 to at least X1=X1.0+λ/2 in N steps of ΔX=λ/(2N),
      d2) measure s-parameters and save in a file S1 including Sij(X1,X2.0);
   e) return the first tuning probe to position X1=X1.0;
   f) in a second move-measurement loop f1) move the second tuning probe from $X2=X2.0$ to at least $X2=X2.0+\lambda/2$ in N steps of $\Delta X=\lambda/(2N)$,
f2) measure s-parameters and save in a file S2 including $Sij(X1.0,X2)$;
g) in a third move-measurement loop
move the first tuning probe from $X1=X1.0$ to at least $X1=X1.0+\lambda2$ in steps of $\Delta X$ and, for each movement of the first tuning probe, move the second moving probe from $X2=X1-M*\Delta X$ to $X2=X1+M*\Delta X$ in steps of $\Delta X$, with M=0, 1, 2, 3 . . . and measure s-parameters and save in files SK including $Sij(X1, X2)$, for $3 \leq K \leq 3+2M$;
h) in a numerical cascading loop for all permutations $\{X1,X2\}$
if the first tuning probe is closer to the test port $(X1 \leq X2)$ de-embed s-parameters of the second tuning probe: cascade s-parameters $[S1]*[S0]^{-1}*[S2]$ and save in file C1;
if the second tuning probe is closer to the test port $(X1>X2)$ de-embed the first tuning probe: cascade s-parameters $[S2]*[S0]^{-1}*[S1]$ and save in file C2;
i) concatenate s-parameters of files C1 with C2, replace s-parameters with data from files SK and save s-parameters $Sij(X1,X2)$ in a tuner calibration file C(F).

2. The calibration method as in claim 1 wherein
the slots of the waveguide slide screw tuner to which the calibration method applies are at least one half of a wavelength ($\lambda/2$) long at a minimum operation frequency (Fmin).

3. The calibration method as in claim 1 wherein
the tuning probes of the waveguide slide screw tuner to which the calibration method applies are controlled by remotely controlled stepper motors and appropriate gear.

4. The calibration method as in claim 1 wherein
the tuning probes of the waveguide slide screw tuner to which the calibration method applies are metallic or at least partly metallized rods.

5. The calibration method as in claim 1 wherein
the tuning probes of the waveguide slide screw tuner to which the calibration method applies are metallic or at least partly metallized slabs.

6. The calibration method as in claim 1 wherein
the tuning probes of the waveguide slide screw tuner to which the calibration method applies are inserted contactless into the slots.

7. The calibration method as in claim 1 wherein the initialization coordinates of the tuning probes of the waveguide slide screw tuner to which the calibration method applies are $X1.0=X2.0=0$.

8. An impedance synthesis (tuning) method for the two-probe waveguide slide screw tuner calibrated using the calibration method as in claim 1 comprising the following steps:
a) enter a frequency F;
b) enter a target reflection factor Gamma;
c) load s-parameters $Sij(X1,X2)$ from calibration file C(F) in memory;
d) in a search loop for all permutations $\{X1,X2\}$
  d1) compare $S11(X1,X2)$ with Gamma;
  d2) if $|S11(X1,X2)-Gamma|$ is minimum, save $X1.T=X1$, $X2.T=X2$;
e) move the first tuning probe to X1.T and the second tuning probe to X2.T.

* * * * *